(12) United States Patent
Choi et al.

(10) Patent No.: US 9,707,744 B2
(45) Date of Patent: Jul. 18, 2017

(54) LAMINATION APPARATUS

(71) Applicant: Samsung Display Co., Ltd., Yongin (KR)

(72) Inventors: Chul Hyun Choi, Yongin-si (KR); Sung Woo Cho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 363 days.

(21) Appl. No.: 14/470,228

(22) Filed: Aug. 27, 2014

(65) Prior Publication Data
US 2015/0321457 A1 Nov. 12, 2015

(30) Foreign Application Priority Data

May 8, 2014 (KR) ........................ 10-2014-0054865

(51) Int. Cl.
*B32B 37/00* (2006.01)
*B32B 38/00* (2006.01)
*H01L 51/00* (2006.01)
*H01L 27/32* (2006.01)

(52) U.S. Cl.
CPC .......... *B32B 37/0046* (2013.01); *B32B 38/00* (2013.01); *H01L 51/0096* (2013.01); *B32B 2038/0076* (2013.01); *B32B 2310/0831* (2013.01); *B32B 2457/206* (2013.01); *H01L 27/3241* (2013.01); *Y02E 10/549* (2013.01)

(58) Field of Classification Search
CPC .. B32B 37/0046; B32B 38/00; H01L 51/0096
See application file for complete search history.

(56) References Cited

U.S. PATENT DOCUMENTS

| | | | | |
|---|---|---|---|---|
| 4,392,187 A | * | 7/1983 | Bornhorst | F21S 2/00 362/233 |
| 8,851,144 B2 | * | 10/2014 | Forbis | E04B 1/80 160/135 |
| 2006/0244943 A1 | * | 11/2006 | Opower | G03F 7/70391 355/72 |

FOREIGN PATENT DOCUMENTS

| | | |
|---|---|---|
| KR | 10-2005-0007072 | 1/2005 |
| KR | 10-2008-0110976 | 12/2008 |
| KR | 10-2009-0065038 | 6/2009 |
| KR | 10-1355582 | 1/2014 |
| KR | 10-1357592 | 2/2014 |

* cited by examiner

*Primary Examiner* — Daniel McNally
(74) *Attorney, Agent, or Firm* — H.C. Park & Associates, PLC

(57) ABSTRACT

A lamination apparatus includes a plurality of fixed frames, each of which has at least one bent portion; a plurality of variable frames, each of which is arranged between one fixed frame and another fixed frame; and a plurality of light sources arranged on the fixed frames and the variable frame.

15 Claims, 7 Drawing Sheets

LAMINATION APPARATUS

CROSS-REFERENCE TO RELATED APPLICATION

This claims priority from and the benefit of Korean Patent Application No. 10-2014-0054865, filed on May 8, 2014, which is hereby incorporated by reference for all purposes as if fully set forth herein.

BACKGROUND

Field

Exemplary embodiments relate to a lamination apparatus, and, more particularly, to a lamination apparatus that laminates a display panel and a window.

Discussion of the Background

A display device that implements various pieces of information on a screen is the core technology of the present information and communication generation, and has been continuously improved to be thinner, lighter, more portable, and have better performance. Accordingly, a flat display device, such as an organic light emitting display, has been spotlighted to reduce the weight and volume of the display device, which are significant disadvantages of a cathode ray tube (CRT).

Because the organic light emitting display has self-luminous characteristics and does not require any separate light source, unlike a liquid crystal display, it is possible to reduce the thickness and weight of the organic light emitting display. Further, the organic light emitting display exhibits many high-quality characteristics, such as low power consumption, high luminance, and high response speed.

Recently, for a slim display module such as a smart phone, a touch sensor is formed on a display panel of an organic light emitting display, and a display panel array, in which a window is laminated on a display panel using resin, is supplied to a display module manufacturer.

The above information disclosed in this Background section is only for enhancement of understanding of the background of the inventive concept, and, therefore, it may contain information that does not constitute prior art.

SUMMARY

Exemplary embodiments provide a lamination apparatus which can be applied to display devices having various sizes.

Exemplary embodiments also provide a lamination apparatus that can uniformly maintain adhesion performance of a corner portion in adhering a display panel and a window to each other.

Additional features of the invention will be set forth in the description which follows, and in part will become apparent to those having ordinary skill in the art upon examination of the following or may be learned from practice of the invention.

An exemplary embodiment of the inventive concept discloses a lamination apparatus including: a plurality of fixed frames, each of which has at least one bent portion; a variable frame arranged between each two adjacent fixed frames; and a plurality of light sources arranged on the fixed frames and the variable frame.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain the principles of the inventive concept.

The above and other objects, features and advantages of the present invention will be more apparent from the following detailed description taken in conjunction with the accompanying drawings.

DETAILED DESCRIPTION OF THE ILLUSTRATED EMBODIMENTS

Figure 1:
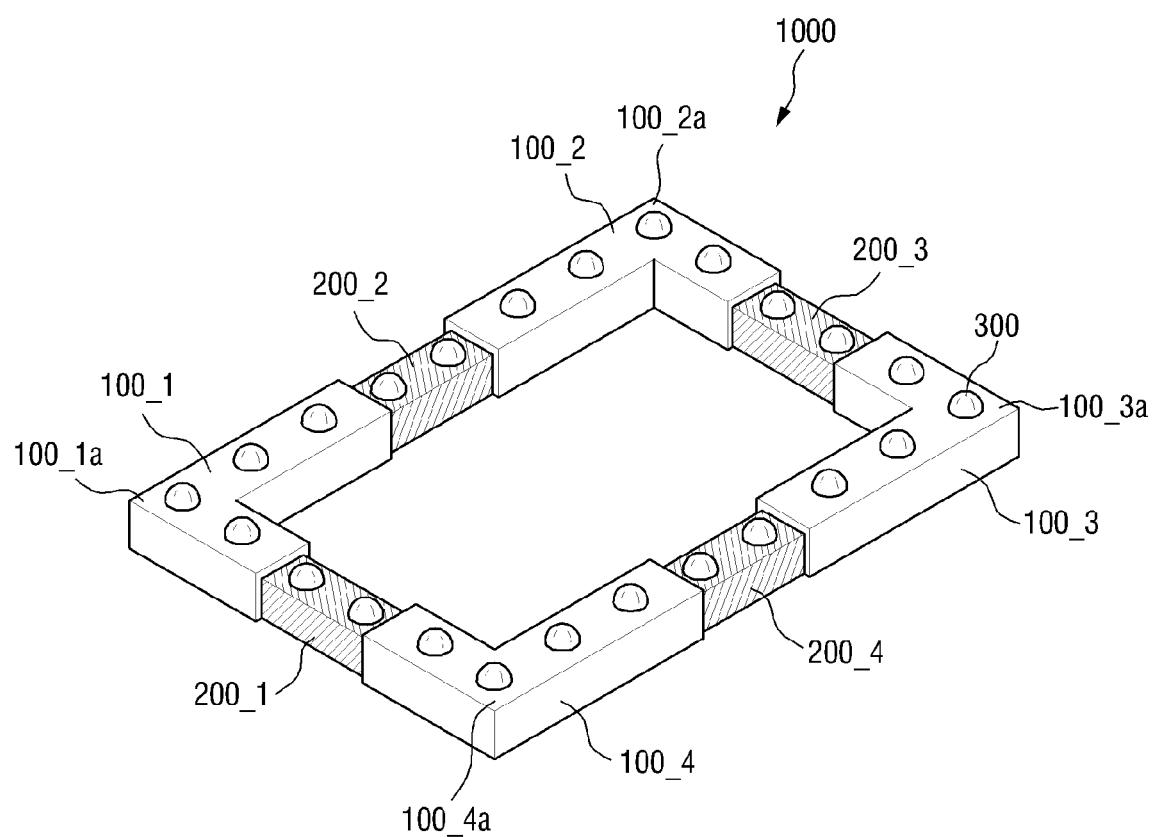
FIG. 1 is a perspective view of a lamination apparatus according to an exemplary embodiment of the present inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
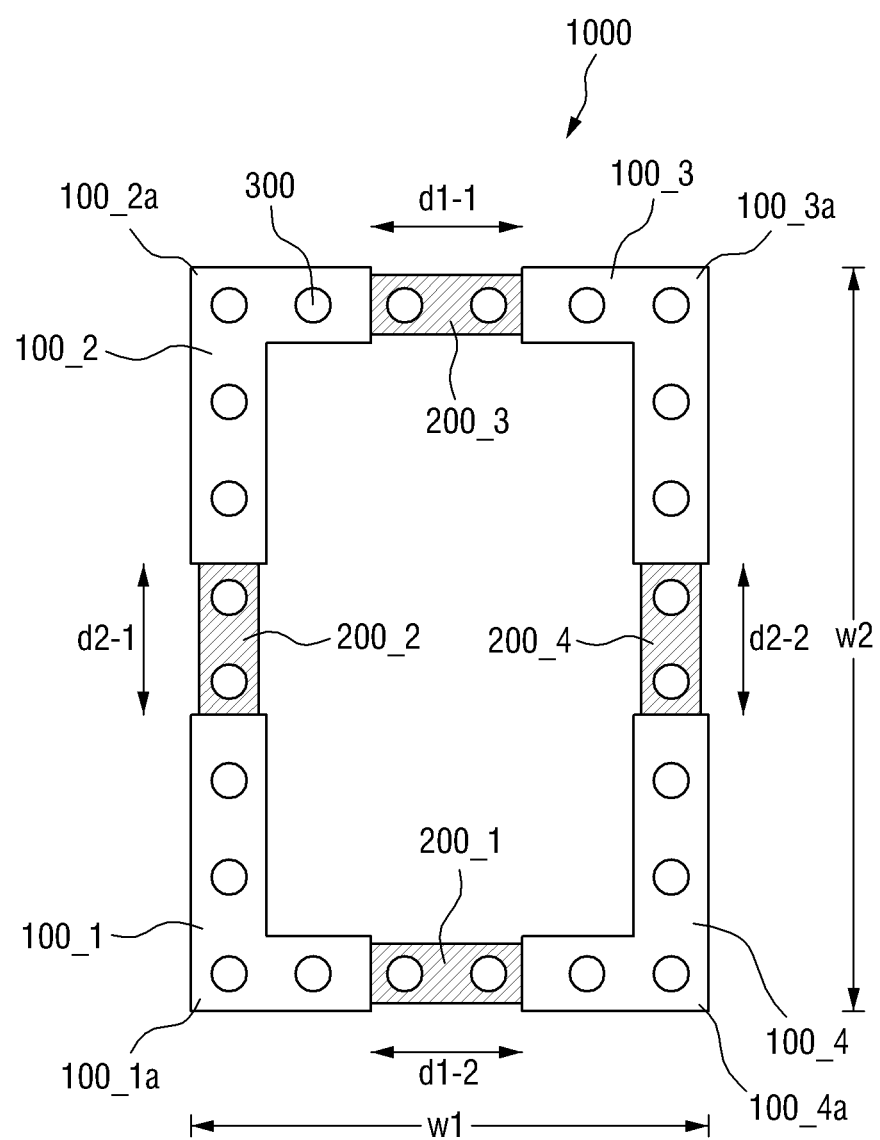
FIG. 2 is a plan view of the lamination apparatus of FIG. 1.

Referring to FIGS. 1 and 2, a lamination apparatus 1000 includes a fixed frame having at least one bent portion, a variable frame arranged between the fixed frame and another fixed frame, and a plurality of light sources arranged on the fixed frame and the variable frame.

Each fixed frame **100_*x* may have at least one bent portion. FIG. 1 illustrates, for example, a case where each fixed frame 100_*x*** has one bent portion, but the number of bent portions is not limited thereto.

The lamination apparatus 1000 has a rectangular frame shape, but the scope of the present invention is not limited to the exemplary embodiments described below.

In an exemplary embodiment, the lamination apparatus 1000 may include first through fourth fixed frames 100_1, 100_2, 100_3, and 100_4, as shown in FIG. 1. The first to fourth fixed frames 100_1 to 100_4 may include bent portions 100_1*a*, 100_2*a*, 100_3*a*, and 100_4*a*, respectively. In other words, the first to fourth fixed frames 100_1 to 100_4 may be "L"-shaped.

In other words, the first to fourth fixed frames 100_1 to 100_4 may form corner portions of the rectangular frame.

The first to fourth fixed frames 100_1 to 100_4 may be made of a metal material, but the material of the first to fourth fixed frames 100_1 to 100_4 is not limited thereto. Any material having hardness enough to maintain the shape may be used as the material of the first to fourth fixed frames 100_1 to 100_4.

One of a plurality of variable frames **200_*x* may be arranged between the fixed frames 100_*x*. The variable frame 200_*x* may serve to adjust the distance between the adjacent fixed frames 100_*x***.

In the exemplary embodiment shown in FIG. 1, the lamination apparatus 1000 may include four variable frames **200_*x*, referred to as the first variable frame 200_1, the second variable frame 200_2, the third variable frame 200_3, and the fourth variable frame 200_4**.

That is, the variable frame **200_*x* may form a part of one side of the rectangular frame shape. As described above, the variable frame 200_*x* may serve to adjust the distance between the adjacent fixed frames 100_*x*. By lengthening or shortening the length of the space that is occupied by the variable frame 200_*x* among the entire horizontal length w1 and vertical length w2 of the lamination apparatus 1000, the distance between the adjacent fixed frames 100_*x*** can be lengthened or shortened. This will be described in detail later.

In an exemplary embodiment, the first variable frame 200_1, the second variable frame 200_2, the third variable frame 200_3, and the fourth variable frame 200_4 may have a bar shape that extends in one direction.

The first variable frame 200_1, the second variable frame 200_2, the third variable frame 200_3, and the fourth variable frame 200_4 may be made of a metal material, but the material of the first variable frame 200_1, the second variable frame 200_2, the third variable frame 200_3, and the fourth variable frame 200_4 is not limited thereto. Any material having hardness enough to maintain the shape may be used as the material of the first to fourth variable fames 200_1 to 200_4.

A plurality of light sources 300 may be arranged on the fixed frame **100_*x* and the variable frame 200_*x*. The light source 300 may serve to cure resin (to be described later) through generation of light. For this, the light source 300 may be a source of ultra violet (UV) radiation, but is not limited thereto. The light source 300 may, for example, be at least one light emitting diode (LED). Although not shown, the light source 300** may be connected to a power supply device which supplies power for generating light.

In an exemplary embodiment, at least one light source 300 may be arranged on the bent portions 100_1a, 100_2a, 100_3a, and 100_4a of the first to fourth fixed frames 100_1 to 100_4. If at least one light source 300 is arranged on the bent portions 100_1a, 100_2a, 100_3a, and 100_4a of the first to fourth fixed frames 100_1 to 100_4, the adhesion performance of a corner portion of the display panel to be adhered can be uniformly maintained regardless of the size of the display panel.

That is, in the case where the lamination apparatus 1000 includes the fixed frame 100_x and the variable frame 200_x, the total size of the lamination apparatus 1000 can be adjusted according to the size of the display panel to be adhered. Even in this case, by constantly maintaining the adhesion performance of the corner portion of the display panel, a degradation in adhesion resulting from non-uniform adhesion of the corner portion of the display panel can be prevented.

Hereinafter, a lamination apparatus 1000 according to an exemplary embodiment of the present invention will be described in more detail.

Referring to FIG. 2, the variable frames 200_x may be arranged between the fixed frames 100_x.

More specifically, the second variable frame 200_2 may be arranged between the first fixed frame 100_1 and the second fixed frame 100_2, and the third variable frame 200_3 may be arranged between the second fixed frame 100_2 and the third fixed frame 100_3. The fourth variable frame 200_4 may be arranged between the third fixed frame 100_3 and the fourth fixed frame 100_4, and the first variable frame 200_1 may be arranged between the fourth fixed frame 100_4 and the first fixed frame 100_1. Thus, the lamination apparatus 1000 according to this exemplary embodiment may be in the form of a rectangular frame as a whole, and in this case, the first variable frame 200_1 may face the third variable frame 200_3, and the second variable frame 200_2 may face the fourth variable frame 200_4.

Figure 3:
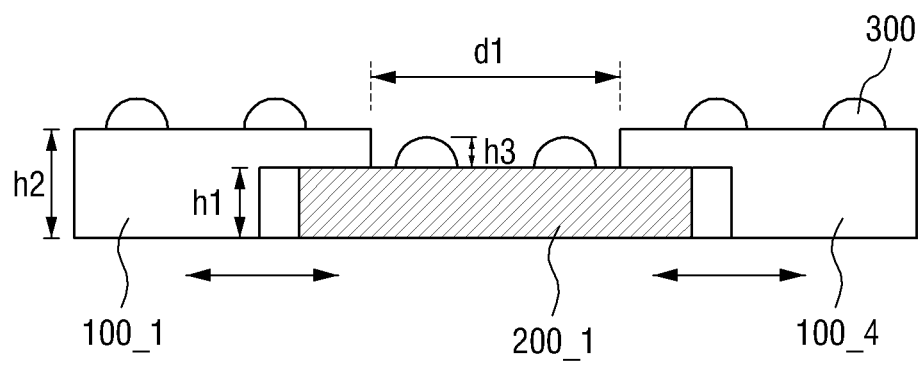
FIG. 3 is a side view of a lamination apparatus according an exemplary embodiment of the present inventive concept.

As shown in FIG. 3, of the horizontal length w1 and the vertical length w2 of the lamination apparatus 1000, the length d1 of the space that is occupied by the first variable frame 200_1 or the third variable frame 200_3, and the length d2 of the space that is occupied by the second variable frame 200_2 or the fourth variable frame 200_4 (similar to what is shown in FIG. 3 for length d1) may be varied. Accordingly, the horizontal length w1 and the vertical length w2 of the lamination apparatus 1000 may be changed. That is, if the length d1 of the spaces that are occupied by the first variable frame 200_1 or the third variable frame 200_3 are lengthened, the horizontal length w1 of the lamination apparatus 1000 may also be lengthened, while if the length d1 of the spaces that are occupied by the first variable frame 200_1 or the third variable frame 200_3 are shortened, the horizontal length w1 of the lamination apparatus 1000 may also be shortened. In the same manner, if the length d2 of the spaces that are occupied by the second variable frame 200_2 or the fourth variable frame 200_4 are lengthened, the vertical length w2 of the lamination apparatus 1000 may also be lengthened, while if the length d2 of the spaces that are occupied by the second variable frame 200_2 or the fourth variable frame 200_4 are shortened, the vertical length w2 of the lamination apparatus 1000 may also be shortened. However, even in this case, the length d1_1 of the space that is occupied by the first variable frame 200_1 may be substantially equal to the length d1_2 of the space that is occupied by the third variable frame 200_3, and accordingly, the horizontal length w1 of the lamination apparatus 1000 can be constantly maintained over the entire region. In the same manner, the length d2_1 of the space that is occupied by the second variable frame 200_2 may be substantially equal to the length d2_2 of the space that is occupied by the fourth variable frame 200_4, and accordingly, the vertical length w2 of the lamination apparatus 1000 may be constantly maintained over the entire region.

As described above, if the horizontal length w1 and the vertical length w2 of the lamination apparatus 1000 are constantly maintained over the entire region, the entire shape of the lamination apparatus 1000 can be constantly maintained. That is, even if the horizontal length w1 and the vertical length w2 are changed, the lamination apparatus 1000 can maintain its rectangular frame shape. However, it is apparent that there may be a possibility of an occurrence of a difference in size between the rectangular frames.

Referring to FIG. 3, both ends of the variable frame 200_x may be inserted into both ends of the fixed frame 100_x.

In an exemplary embodiment, the both ends of the variable frame 200_x may be inserted into the both ends of the fixed frame 100_x. Hereinafter, for convenience in explanation, the first fixed frame 100_1, the first variable frame 200_1, and the fourth fixed frame 100_4 will be exemplarily described. Because the relationships between the remaining fixed frames 100_x and the variable frames 200_x may be substantially equal to each other, the description thereof will be omitted.

As described above, the first variable frame 200_1 may be arranged between the first fixed frame 100_1 and the fourth fixed frame 100_4. In an exemplary embodiment, both ends of the first variable frame 200_1 may be at least partially and slidably inserted into the first fixed frame 100_1 and the fourth fixed frame 100_4. Each of the first fixed frame 100_1 and the fourth fixed frame 100_4 may include an internal space that extends in the lengthwise direction so that the first variable frame 200_1 can be inserted therein.

In an exemplary embodiment, parts of the both ends of the first variable frame 200_1 may be inserted into the first fixed frame 100_1 and the fourth fixed frame 100_4 to slide.

In an exemplary embodiment, the height h2 of the first fixed frame 100_1 and the fourth fixed frame 100_4 may be larger than the height h1 of the first variable frame 200_1. Further in another exemplary embodiment, a value that is obtained by subtracting the height h1 of the first variable frame 200_1 from the height h2 of the first fixed frame 100_1 and the fourth fixed frame 100_4 may be larger than the height h3 of the light source 300 that is arranged on the first variable frame 200_1. In this case, when both ends of the first variable frame 200_1 are inserted into the first fixed frame 100_1 and the fourth fixed frame 100_4, a portion of the light source 300 can be inserted therein at least partly. That is, because the height of the internal space of the first fixed frame 100_1 and the fourth fixed frame 100_4 is secured so that even if only a portion of the light source 300 can be inserted therein, the variable width of the first variable frame 200_1 may become large. In other words, the difference between the maximum length and the minimum length occupied by the first variable frame 100_1 may be maximized.

Figure 4:
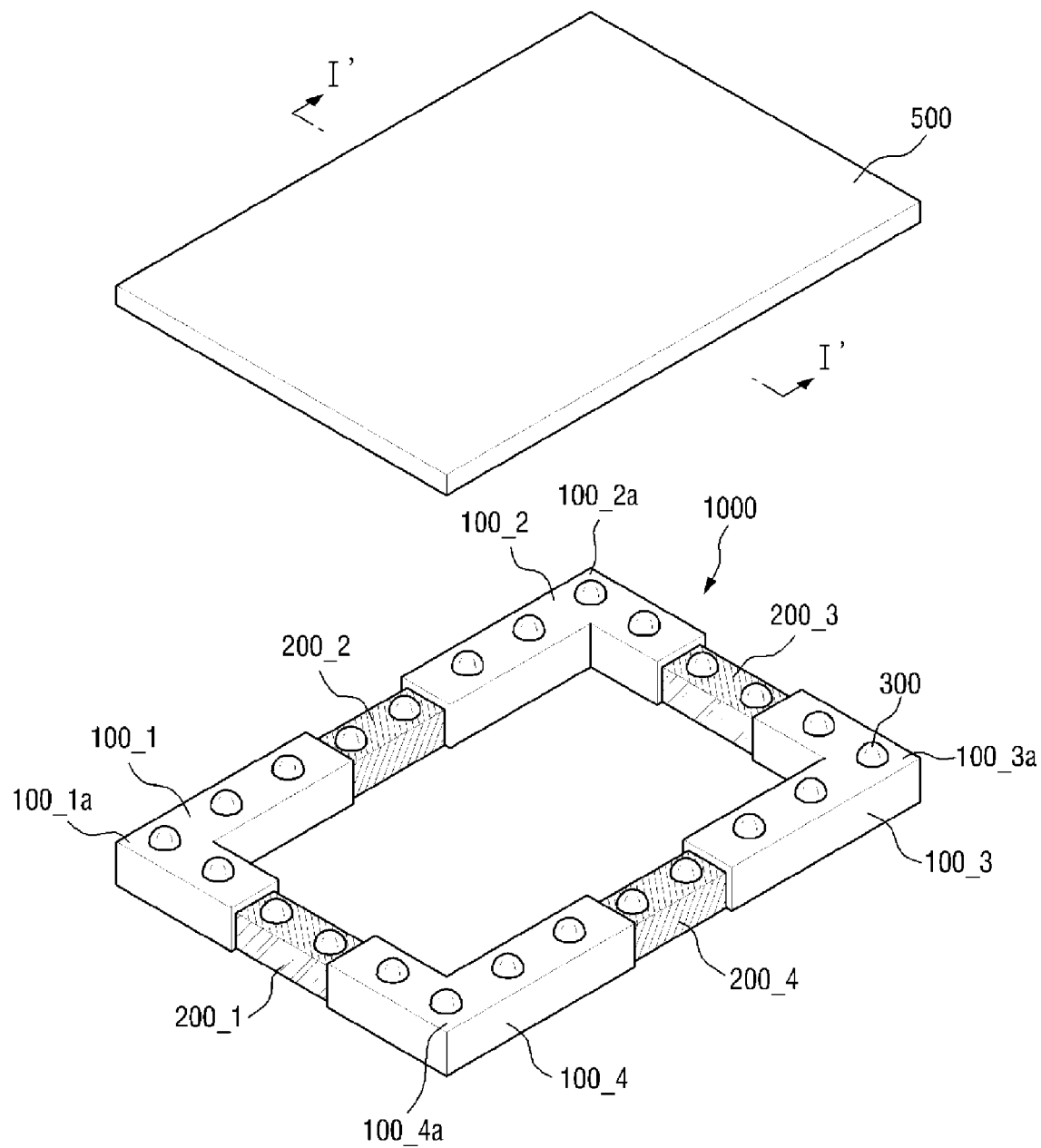
FIG. 4 is a perspective view of a lamination apparatus according to an exemplary embodiment of the present inventive concept.

Referring to FIG. 4, a display device 500 may be arranged on the lamination apparatus 1000 according to an exemplary embodiment.

As described above, the lamination apparatus 1000 according to an exemplary embodiment may be in a rectangular frame shape, and thus, the display device 500 may be in a rectangular shape having a corresponding circumference. For example, the horizontal length and the vertical length of the display device 500 may be substantially equal to the horizontal length w1 and the vertical length w2 of the lamination apparatus 1000. That is, as described above, because both the horizontal length w1 and the vertical length w2 of the lamination apparatus 1000 are variable, the size of the lamination apparatus 1000 can be adjusted to match the size of the circumference of the display device 500 having various sizes.

Figure 5:
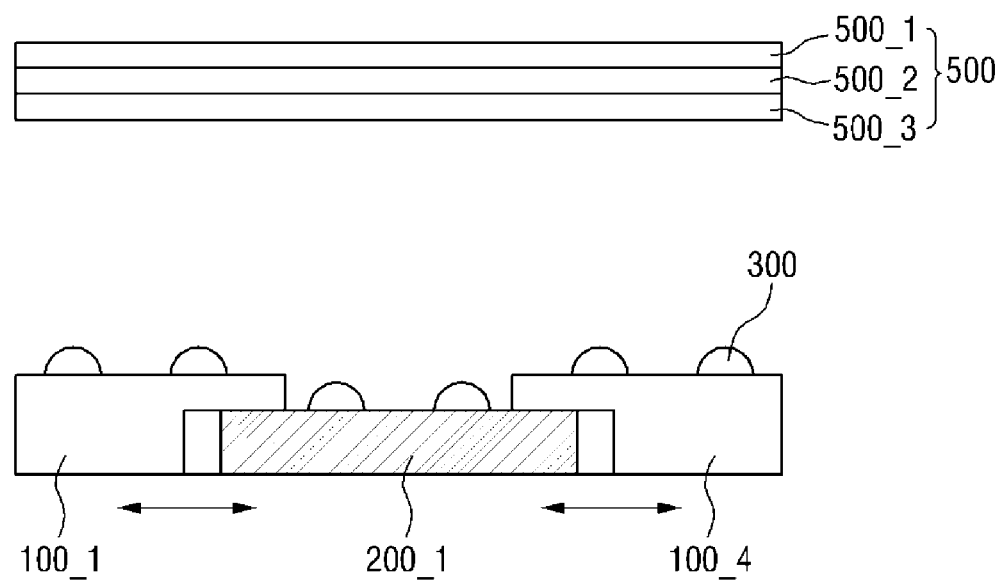
FIG. 5 is a cross-sectional view cut along line I-I' of FIG. 4.

Referring to FIG. 5, the display device 500 may include a display panel 500_1, an adhesive layer 500_2, and a window panel 500_3.

The display panel 500_1 may be a panel on which an image is displayed. In the description, the display panel is a display panel for displaying an image, and may include an LCD (Liquid Crystal Display) panel, an OLED (Organic Light Emitting Diode) panel, an LED (Light Emitting Diode) panel, an inorganic EL (Electroluminescent) display panel, an FED (Field Emission Display) panel, an SED (Surface-conduction Electro-emitter Display) panel, a PDP (Plasma Display Panel), or a CRT (Cathode Ray Tube) display panel 500_1.

However, the above-described kinds of display panels are exemplary, and other kinds of the display panels may also be used. Further, the display panel may include not only a rigid panel, but also a flexible panel that can be bent, folded, or rolled.

Further, although not illustrated in the drawing, the display panel 500_1 may be a TSP (Touch Screen Panel), including all known touch panels, and a detailed description thereof is omitted.

The window panel 500_3 is a member that has a transparent flat shape, and may be formed of a transparent material, such as glass, polyethylenetherephtalate (PET), or acryl. In the description, the term "transparency" may be include full transparency that passes 100% of light, as well as semi-transparency that only partially passes the light. In another exemplary embodiment, the window panel 500_3 may include a flat portion and a bent portion. The adhesive layer 500_2 may be interposed between the display panel 500_1 and the window panel 500_3. In an exemplary embodiment, the adhesive layer 500_2 may be UV-curable resin.

Figure 6:
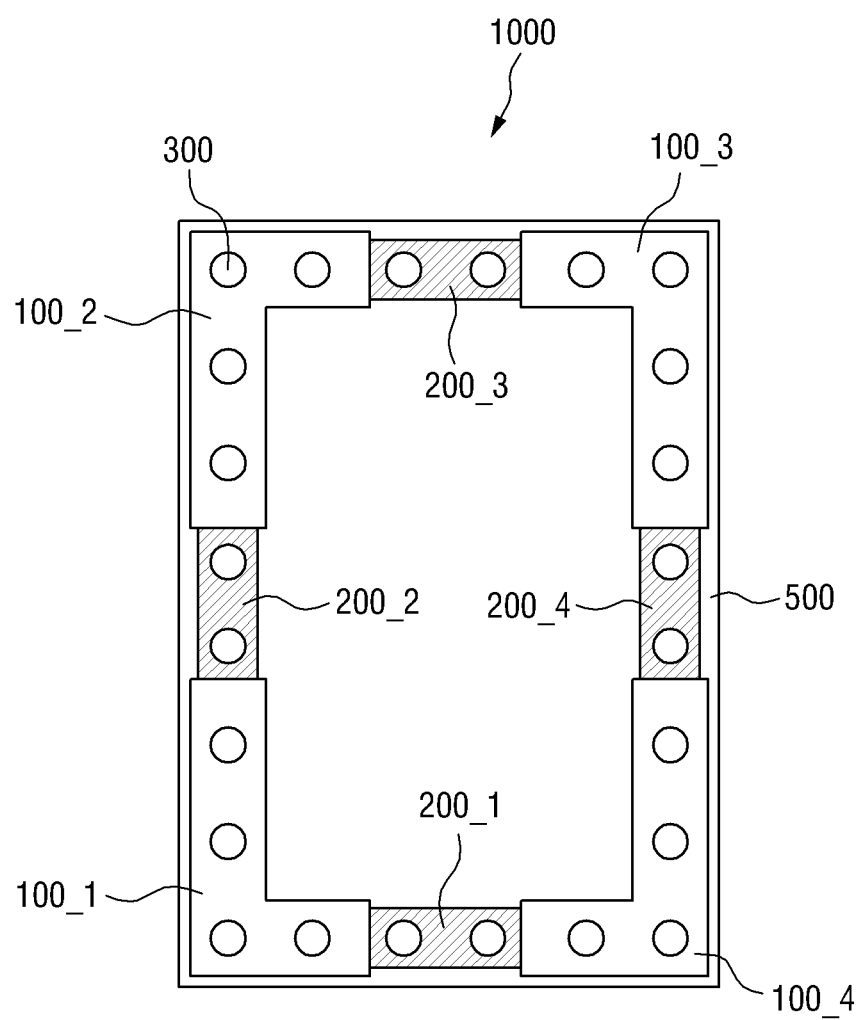
FIG. 6 is a plan view of a lamination apparatus according to an exemplary embodiment of the present inventive concept.

Referring to FIG. 6, the lamination apparatus 1000 may be arranged to correspond to the circumference of the display device 500. That is, the horizontal length w1 and the vertical length w2 of the lamination apparatus 1000 can be adjusted to match the size of the circumference of the display device 500. Further, a constant quantity of light can be provided to the corner portion of the display device 500 by the fixed frame 100 having the bent portion, and thus the adhesion performance of the corner portion can be uniformly maintained regardless of the size of the display device 500 as described above.

Figure 7:
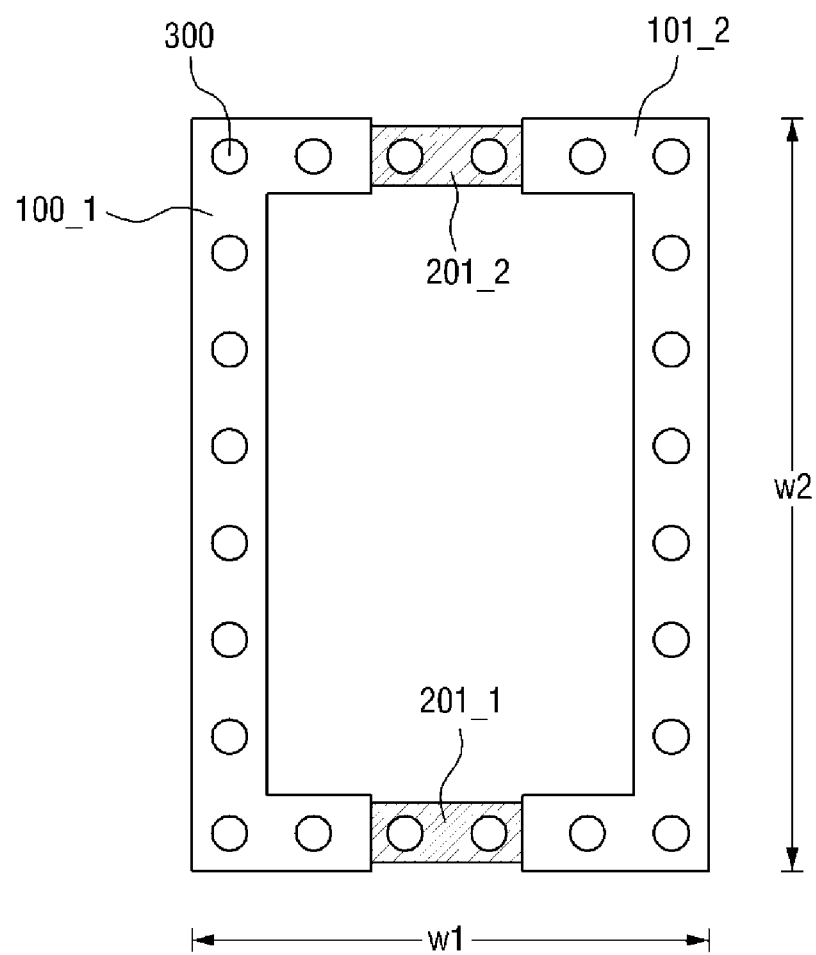
FIG. 7 is a plan view of a lamination apparatus according to another exemplary embodiment of the present inventive concept.

FIG. 7 is a plan view of a lamination apparatus according to another exemplary embodiment of the present invention.

Referring to FIG. 7, a lamination apparatus according to another embodiment of the present invention may include two fixed frames 101 and two variable frames 201 arranged between the two fixed frames 101.

In an exemplary embodiment, the lamination apparatus may be "⊏"-shaped, and may include two fixed frames that face each other. For convenience in explanation, the two fixed frames are called a first fixed frame 101_1 and a second fixed frame 101_2. In the same manner as described above, a first variable frame 201_1 and a second variable frame 201_2 having a bar shape may be arranged between the first fixed frame 101_1 and the second fixed frame 101_2.

As described above, by the first and second fixed frames 101_1 and 101_2 of the "⊏" shape, and the first and second variable frames 201_1 and 201_2 having a bar shape, the lamination apparatus can be maintained in the rectangular frame shape (see FIG. 7).

Through this, the vertical length w2 of the lamination apparatus may be fixed, and the horizontal length w1 thereof may be varied. Because the operation of the variable frame 201 and the relationship between the variable frame 201 and the fixed frame 101 may be substantially equal to those of the lamination apparatus according to an exemplary embodiment of the present invention as described above, the detailed description thereof will be omitted.

The disclosed exemplary embodiments provide a lamination apparatus which is capable of uniformly maintaining the adhesion performance of a corner portion when the display panel and the window are adhered to each other.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A lamination apparatus comprising:
   a plurality of fixed frames, each of which comprises at least one bent portion;
   a plurality of variable frames, each of which is arranged between each two adjacent fixed frames; and
   a plurality of light sources disposed on the fixed frames and the variable frames,
   wherein a height of each of the fixed frames is greater than a height of each of the variable frames.

2. The lamination apparatus of claim 1, wherein:
   the fixed frames comprise a first fixed frame, a second fixed frame, a third fixed frame, and a fourth fixed frame; and
   the first to fourth fixed frames have an "L" shape.

3. The lamination apparatus of claim 2, wherein the variable frames comprise a first variable frame, a second variable frame, a third variable frame, and a fourth variable frame, and the first to fourth variable frames each have a bar shape.

4. The lamination apparatus of claim 3, wherein the lamination apparatus has a rectangular frame shape.

5. The lamination apparatus of claim 4, wherein a length in a first direction of the lamination apparatus is increased when a length of a space that is occupied by the first variable frame or the third variable frame is increased, and is decreased when a length of a space that is occupied by the first variable frame or the third variable frame is decreased.

6. The lamination apparatus of claim 5, wherein a length in a second direction, which is perpendicular to the first direction, of the lamination apparatus is increased when a length of a space that is occupied by the second variable frame or the fourth variable frame is increased, and is decreased when a length of a space that is occupied by the second variable frame or the fourth variable frame is decreased.

7. The lamination apparatus of claim 4, wherein a display device, which includes a display panel, an adhesive layer, and a window panel, is arranged on the lamination apparatus, and a horizontal length and a vertical length of the lamination apparatus are varied to correspond to a horizontal length and a vertical length of the display device.

8. The lamination apparatus of claim 3, wherein the second variable frame is disposed between the first fixed frame and the second fixed frame, the third variable frame is disposed between the second fixed frame and the third fixed frame, the fourth variable frame is disposed between the third fixed frame and the fourth fixed frame, and the first variable frame is disposed between the fourth fixed frame and the first fixed frame.

9. The lamination apparatus of claim 2, wherein at least one of the light sources is disposed on the bent portions of the first to fourth fixed frames.

10. The lamination apparatus of claim 1, wherein the fixed frame comprises a first fixed frame and an opposing second fixed frame, each having a " ⊏ " shape.

11. The lamination apparatus of claim 10, wherein:
the variable frame comprises a first variable frame and a second variable frame, each having a bar shape; and
the first variable frame and the second variable frame are disposed between the first fixed frame and the second fixed frame.

12. The lamination apparatus of claim 1, wherein the light sources are configured to emit UV rays.

13. The lamination apparatus of claim 1, wherein both ends of each of the variable frames are at least partially and slidably inserted into the adjacent fixed frames.

14. The lamination apparatus of claim 1, wherein a difference in the heights of the variable frame and the fixed frame is greater than the height of the light sources arranged on the variable frame.

15. A lamination apparatus comprising:
a plurality of fixed frames, each of which comprises at least one bent portion;
a plurality of variable frames, each of which is arranged between each two adjacent fixed frames; and
a plurality of light sources disposed on the fixed frames and the variable frames,
wherein:
a display device, which comprises a display panel, an adhesive layer, and a window panel, is disposed on the fixed frames and variable frames; and
a light generated by the light sources cures the adhesive layer.

* * * * *